United States Patent [19]
Trumper et al.

[11] Patent Number: 6,003,230
[45] Date of Patent: Dec. 21, 1999

[54] MAGNETIC POSITIONER HAVING A SINGLE MOVING PART

[75] Inventors: David L. Trumper, Plaistow, N.H.; Won-Jong Kim, Cambridge, Mass.

[73] Assignee: Massachusetts Institute of Technology, Cambridge, Mass.

[21] Appl. No.: 08/943,387

[22] Filed: Oct. 3, 1997

[51] Int. Cl.$^6$ .............................. G01B 7/00; B23Q 16/00; B25H 1/00
[52] U.S. Cl. .............................. 33/1 M; 33/568; 33/573; 33/DIG. 1
[58] Field of Search ............................ 33/1 M, 568, 573, 33/DIG. 1

[56] References Cited

U.S. PATENT DOCUMENTS

| | | |
|---|---|---|
| 3,376,578 | 4/1968 | Sawyer . |
| 4,535,278 | 8/1985 | Asakawa .................................. 318/687 |
| 4,654,571 | 3/1987 | Hinds ...................................... 318/687 |
| 5,631,618 | 5/1997 | Trumper et al. ......................... 335/299 |
| 5,699,621 | 12/1997 | Trumper et al. .......................... 33/1 M |

FOREIGN PATENT DOCUMENTS

| | | |
|---|---|---|
| 0421527A1 | 4/1991 | European Pat. Off. . |
| 0421529 | 4/1991 | European Pat. Off. . |
| 19530341A1 | 2/1997 | Germany . |

OTHER PUBLICATIONS

Trumper, David L., Mark E. Williams and Tiep H. Nguyen, "Magnet Arrays for Synchronous Machines," Presented at 1993 IEEE Ind. Appl. Soc. Annual Meeting, Toronto, Canada, 11 pgs., (Oct. 1993).

Kim, Won-jong and David L. Trumper, "Force Ripple in Surface-Wound Permanent-Magnet Linear Motors," Presented at Intermag 1996, Seattle, Washington, 3 pgs., (Apr. 9-12, 1996).

Trumper, David L., Wong-jong Kim and Mark E. Williams, "Design and Analysis Framework for Linear Permanent-Magnet Machines," *IEEE Transactions on Industry Applications*, 32(2):371-379, (Mar./Apr. 1996).

Buckley, J.D., D.N. Galburt, and C. Karatzas, "Step-and-Scan Lithography Using Reduction Optics," *Journal of Vacuum Science and Technology B*, 7(6):1607-1612, 1989.

Ebihara, D. and M. Watada, "Study of a Basic Structure of Surface Actuator," *IEEE Transactions on Magnetics*, 25(5):3916-3918, 1989.

(List continued on next page.)

*Primary Examiner*—Christopher W. Fulton
*Attorney, Agent, or Firm*—Wolf, Greenfield & Sacks, P.C.

[57] ABSTRACT

A magnetic positioner is provided which is capable of providing long travel in two dimension and short travel in the remaining four dimensions. The positioner has a movable stage and a stator oriented adjacent and substantially parallel to this stage. At least three sets of first magnetic elements, which for preferred embodiments are winding sets capable of generating forces in two directions, are on the portion of the stator adjacent to the stage at any given time, and at least two second magnetic elements, which are magnet arrays for the preferred embodiment, are on the stage adjacent to the stator. At least one of the second magnetic elements overlaps multiple first magnetic elements for all positions of the stage relative to the stator, with one magnet overlapping multiple windings for one preferred embodiment of the invention and two magnets on the stage overlapping multiple windings on the stator for a second embodiment. The windings form a linear motor providing forces in both a corresponding long travel dimension and in a dimension perpendicular to both long travel dimensions.

15 Claims, 2 Drawing Sheets

OTHER PUBLICATIONS

Halbach, K., "Design of Permanent Multipole Magnets with Oriented Rare Earth Cobalt Material," *Nuclear Instruments and Methods*, 169(1):1–10, 1980.

Halbach, K. "Application of Permanent Magnets in Accelerators and Electron Storage Rings," Journal of Applied Physics, 57(8):3605–3608, 1985.

Higuchi, T. and H. Kawakatsu, "Development of a Magnetically Suspended Stepping Motor for Clean–Room Transportation and Sample Handling," Proceedings of the 11th International Conference on Magnetically Levitated Systems and Linear Drives, Magleu '89, pp. 363–368, 1989.

Hinds, W. E. and B. Nocito, "The Sawyer Linear Motor," Proceedings of The Second Symposium on Incremental Motion Control Systems and Devices, pp. W–1–W–10, 1973.

Petla, E. R., "Two Axis Sawyer Motor," Proceedings of the 12th Annual IEEE Industrial Electronics Society Conference, pp. 3–8, 1986.

D. L. Thumper, W.–J. Kim, and M. E. Williams, "Design and Analysis Framework for Permanent–Magnet Machines," *IEEE Transactions on Industry Applications*, 32(2):71–379, Mar./Apr. 1996. Also in the Proceedings of the IEEE Industry Applications Society 29th Annual Meeting, pp. 216–223, Oct. 1994.

MAGNETIC POSITIONER HAVING A SINGLE MOVING PART

This invention was made with government support under contract Number DE-AC04-94AL85000 awarded by the Department of Energy. The government has certain rights in the invention.

FIELD OF THE INVENTION

This invention relates to magnetic positioners and more particularly to a magnetic positioner having a single moving stage with long travel in two dimensions and short travel in at least four additional dimensions.

BACKGROUND OF THE INVENTION

Positioning mechanisms find wide application in industry, research, and military environments. For low-tolerance application in friendly environments, simple two-stage devices having mechanical bearings are frequently adequate. However, for high-precision applications, such as the increasingly fine positioning required in lithography systems used in applications such as semiconductor manufacture, mechanical systems frequently have neither the accuracy, speed, nor reliability required. Further, since such applications are frequently carried out in "clean-room" environments where space is at a premium, and sometimes in low-pressure environments where air-bearings cannot be utilized, magnetic actuators and bearings having as small a footprint as possible are becoming increasingly important options. Magnetic actuators are also advantageous in that they are frictionless, thereby allowing more accurate operation, not generating particles which may result from mechanical bearings and operating at higher speed. Further, magnetic bearings are capable of each providing multiple degrees of freedom, thereby permitting an actuator to provide multiple degrees of freedom with a lesser number of bearings/actuators than would be required with comparable mechanical structures. An example of such a magnetic positioner is shown in "Design and Analysis Framework For Linear Permanent-Magnet Machines," David L. Trumper, Won-Jong, Kim and Mark E. Williams, I.E.E.E. *Transactions on Industry Applications,* 1232 Vol. 32 No. 2, March–April, 1996, pp. 371–79. Other such magnetic positioner systems are shown in U.S. Pat. No. 5,699,621 issued Dec. 23, 1997 entitled POSITIONER WITH LONG TRAVEL IN TWO DIMENSIONS, and U.S. Pat. No. 5,631,618 issued May 20, 1997 entitled MAGNETIC ARRAYS, both of which are assigned to the Assignee of the current application.

While such systems function well in most applications, there are applications, such as those in a clean-room environment or where the positioner is being used in a satellite or space station, where a need exists to keep size to a minimum and to make the system as power-efficient as possible. A need therefore, exists for an improved magnetic positioner which is more compact and more power-efficient than such prior systems, while still providing long travel for a single moving platform or stage in two dimensions and short travel or position control for the stage in the remaining four dimensions.

SUMMARY OF THE INVENTION

In accordance with the above, this invention provides a magnetic positioner capable of providing long travel in two dimensions and short travel in the remaining four dimensions. The positioner has a movable stage and a stator oriented adjacent and substantially parallel to the stage. At least three sets of first magnetic elements are on the portion of the stator adjacent to the stage at any given time and at least two second magnetic elements are on the stage adjacent to the stator. At least one of the second magnetic elements overlaps multiple first magnetic elements for all positions of the stage relative to the stator. Further, at least one of the first and second magnetic elements are sets of multi-phase windings, each adjacent pair of first and second magnetic elements being poled and oriented to form a linear motor providing forces in both a corresponding long-travel dimension and in a dimension perpendicular to both of the long-travel dimensions. For preferred embodiments, one of the first and second magnetic elements are sets of windings and the other of the first and second magnetic elements are magnetic arrays. The magnetic arrays are preferably on the stage and the windings on the stator. To provide long travel over a greater distance in at least one dimension and/or to provide redundancy for enhanced reliability, at least one set of first magnetic elements is not adjacent to the stage at any given time for some embodiments, and, to achieve greater travel range, the at least three first magnetic elements adjacent to the stage at a given time changes as the stage moves in the at least one long-travel dimension.

For a preferred embodiment, there are three sets of windings on the portion of the stator adjacent to the stage, with two of the windings providing drive forces when energized, in a first of the long-travel dimensions and one of the windings providing drive forces, when energized, in a second of the long-travel dimensions. Further, there are no more than two magnetic arrays on the stage adjacent the stator, one of the magnetic arrays being adjacent to at least two of the windings for all positions of the stage relative to the stator. Each magnetic array and the adjacent at least one winding are poled and oriented to form a linear motor providing forces in both the corresponding long-travel dimension and in a dimension perpendicular to both of the long-travel dimensions. A separate mechanism may be provided for normally supporting the weight of the stage, which mechanism includes coacting magnets and targets for preferred embodiments. For the most preferred embodiment, there are two magnetic arrays on the stage, one of which is sized and oriented to be adjacent to the two windings providing forces in the first long-travel dimension and the other of which is oriented to be adjacent to the winding providing forces in the second long-travel dimension. Alternatively, both magnetic arrays on the stage can be sized and oriented to be adjacent two windings, with each magnet array providing forces in a different of the long travel dimensions.

The foregoing and other objects, features and advantages of the invention will be apparent in the following more particular description of preferred embodiments of the invention as illustrated in the accompanying drawings.

IN THE DRAWINGS

Figure 2:
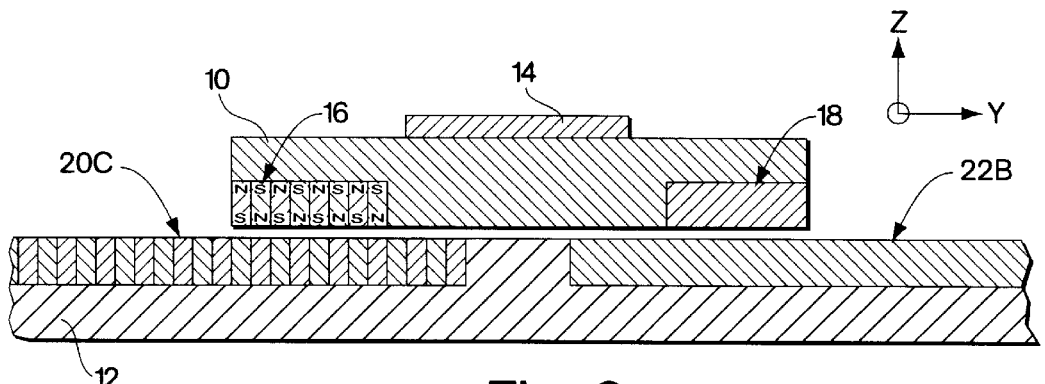
FIG. 2 is a cut-way side view taken along the line 2—2 in FIG. 1.
Figure 2A:
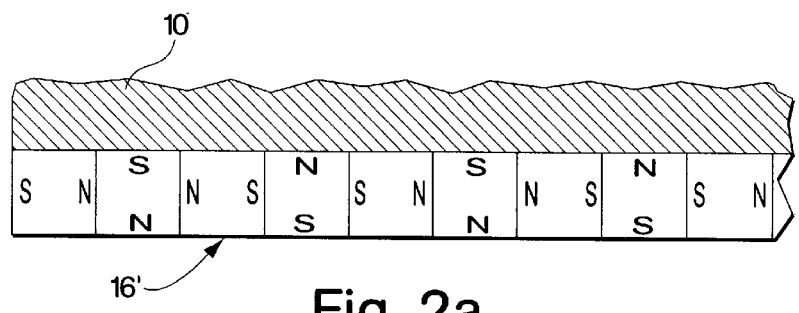

FIG. 2*a* is an enlarged cut-away view of a portion of the FIG. 2 view for an alternative magnet array.

Figure 3:
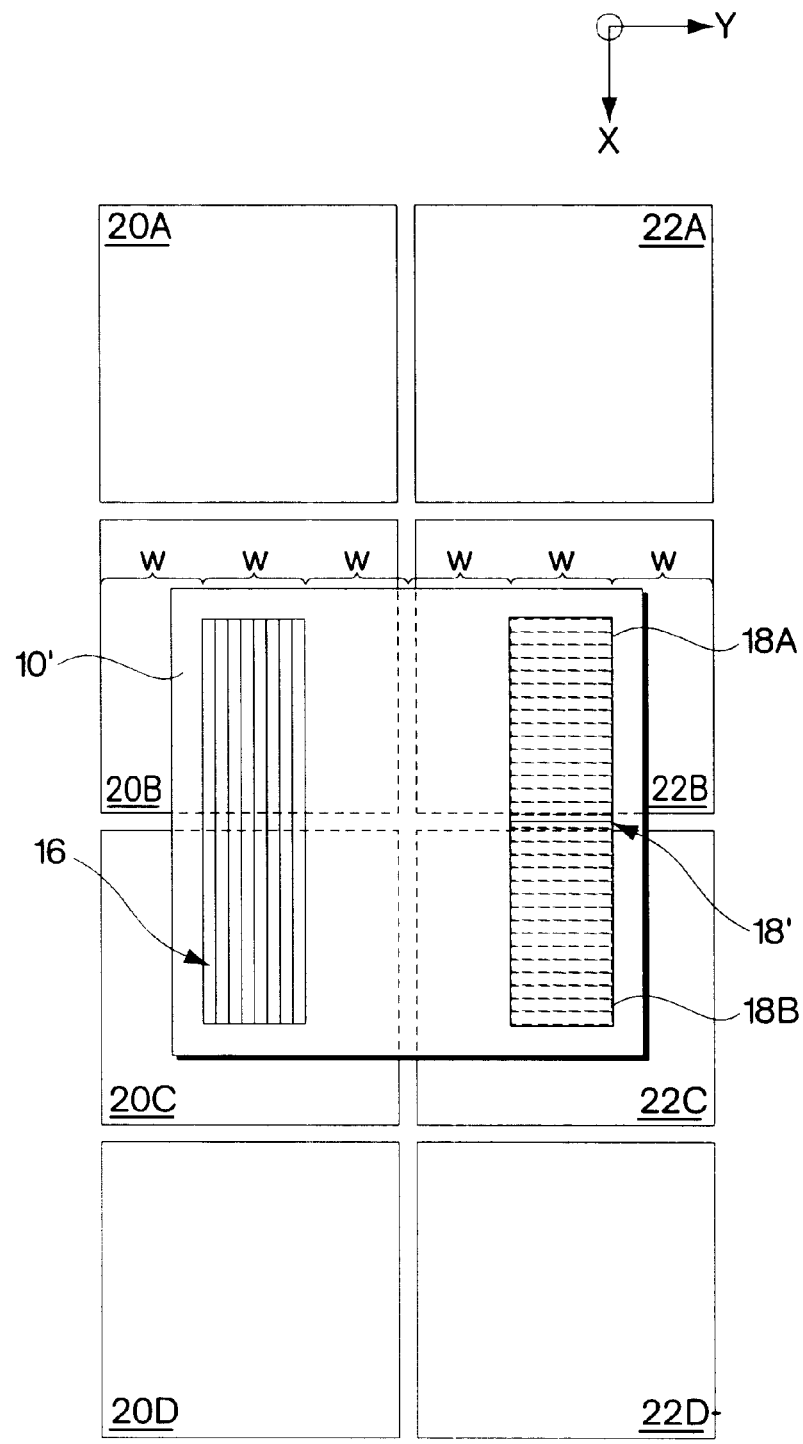

FIG. 3 is a top view of a positioning system illustrating alternative embodiments of the invention.

DETAILED DESCRIPTION

Figure 1:
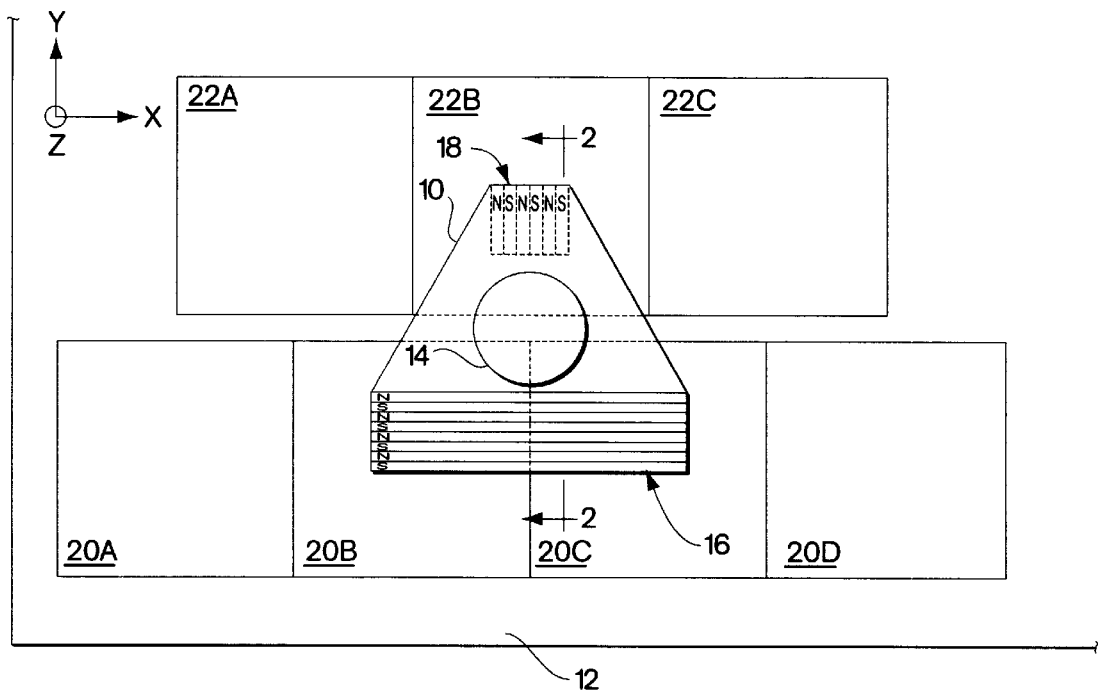
FIG. 1 is a top view of a positioning system in accordance with this invention.

Referring to FIG. 1, a magnetically levitated stage 10 is shown suspended or levitated over a table, platform or other stator 12. Stage 10 has an area 14 where a work-piece may be positioned, for example, a semiconductor component may be positioned in area 14 for lithographic processing; and stage 10 also has magnets 16 and 18 mounted to its underside, which magnets are, for example, poled in a periodic fashion as shown in FIGS. 1 and 2. The exact poling is not critical so long as the arrays are periodic and that the axes of periodicity are not parallel. Thus, the north and south poles on magnets 16 and/or 18 may be reversed and/or the orientation of magnets 16 and 18 may be reversed.

A first set of coils 20A–20D are provided on stator 12 which are positioned to interact with magnet 16 and a second set of coils 22A–22C are provided on stator 12 which are positioned to interact with magnet 18. Each coil 20-22 has at least two phases which are wound so as to provide forces in both the "y" direction and the "z" direction for coils 20 and in both the "x" direction and "z" direction for coils 22. The relative dimensions of magnet 16 and coils 20 and of magnet 18 and coils 22 are such that, for any position of stage 10, magnet 16 is over at least two of the coils 20, and preferably over exactly two of the coils. So long as stage 10 is over coils 20B and 20C as shown, magnet 18 will be over coil 22B. If stage 10 moves in the negative "x" direction so that magnet 16 is over coils 20A and 20B, magnet 18 will move to be over coil 22A; while if stage 10 moves in the positive x direction so that magnet 16 is over coils 20C and 20D, magnet 18 will be over coil 22C. Magnet 18 can overlap two or more of coils 22 as stage 10 moves in the "x" direction. Stage 10 may move in the positive and negative y direction by amounts such that at least a portion of magnet 16 is over two of the coils 20 without being over a coil 22. It is preferable that movement in the y direction be such that all of magnet 16 is over the appropriate two coils 20 and that at least some of magnet 18 is over the appropriate coil or coils 22.

It is known that each of the coils 20, 22 being at least a two phase coil is capable of interaction with magnetic fields of magnets 16, 18 to produce complex magnetic field forces having vectors in both the "y" and "z" direction for the coils 20, and having vectors in both the "x" and "z" direction for the coils 22. The magnitude of these vector forces in each of the directions is determined by the relative amplitude of the currents for each phase of the coils (as well as the magnetic fields of the magnets 16, 18) and by the phase difference between the signals on the phases. Thus, by appropriately selecting the current magnitudes and phases for the currents flowing in the coils 20 and 22 over which magnets 16 and 18 are positioned at a given time, stage 10 may be caused to move in any desired direction to any selected position.

In particular, the coils would be initially energized so as to all generate sufficient forces in the "z" direction to support the weight of stage 10. This would maintain stage 10 suspended over stator/platform 12, without causing any movement of the stage in the "x" or "y" direction. If movement is desired in the "y" direction, the coils 20 over which magnet 16 is positioned, coils 20B, 20C as shown in FIG. 1, would be energized so as to produce two controlled magnetic force vectors in the "y" direction while still providing the force vector in the "z" direction to support the weight of stage 10. Similarly, if motion is desired in the x direction, coil 22 over which magnet 18 is located could be energized to generate a force vector in the "x" direction in addition to the continuing force vector in the z direction. Since a force applied only to magnet 18 could cause rotation of stage 10 about the "z" axis, coils 20B, 20C would also need to be activated to generate a compensating torque about the "z" axis to prevent such rotation. If both coils are operated with equal force but in opposite directions, the rotation can be countered without introducing a net force in the "y" direction.

Movement in the "z" direction can be accomplished by either increasing or decreasing the vector force in the "z" direction generated preferably by all three of the coils, as appropriate. As can be seen in FIG. 2, movements in the "z" direction are relatively small, on the order of 500 micrometers for a typical application. The "z" forces could also be increased to maintain a desired spacing for stage 10 from platform 12 when a workpiece is positioned on stage 10 or to re-establish the desired spacing after the workpiece is removed, or otherwise as required to maintain a desired gap on spacing between stage 10 and stator 12.

Similarly, rotation around the "z" axis can be obtained (or compensated for) by energizing one or more of the coils 20, 22 over which the stage is positioned, and preferably all three, to generate forces creating rotation in the desired direction. Rotation about the "x" axis can be achieved by increasing and decreasing forces in the z direction for the coils 20 and 22 as appropriate to cause the desired rotation. Similarly, rotation about the "y" axis may be obtained by increasing and decreasing forces in the "z" direction for the coils 20B and 20C as appropriate. While the rotation around the "z" axis may be fairly substantial, the rotations around the "x" and "y" axis can be by only a few degrees, depending on the spacing between stage 10 and platform 12.

While not shown in FIGS. 1 and 2 for purposes of simplification, capacitive or other standard gap sensors would be positioned for example on stage 10 to measure the gap between the stage and stator for at least three locations, preferably near each corner of the stage 10. The outputs from the gap sensors would be applied to a suitable processor which would then generate outputs to cause appropriate currents in each of the coils to maintain a desired gap at each sensor. Any desired change in the size of the gap at a given sensor could also be fed into the computer and utilized to provide appropriate currents in the wires of the windings to provide the forces required.

Similarly, laser interferometric apparatus or other suitable position sensors may be utilized to determine the x and y positions and rotations about the z axis of stage 10 and, if desired, can be used either in addition to or instead of gap sensors for determining position in other of the three dimensions. These determinations are applied to a processor (not shown) and may be utilized for generating feedback control signals to maintain the stage in a desired position and to provide feedback controls when the stage is to be moved to a new position so as to permit the stage to be moved rapidly to the new position with minimum overshoot. Sensors of a type suitable for this application and a more detailed discussion on positioning controls are provided in the two copending applications mentioned above and such discussion is incorporated herein by reference.

The equations and algorithms required for producing currents of appropriate magnitude, direction and phase in each phase of wire of each of the windings in order to achieve the desired force vectors from the winding are known in the art. In particular, all n phases would typically be applied simultaneously to each active winding 20, 22, with the relative current applied to each winding for each phase being controlled to achieve the desired force vectors. The commutation laws could, for example be stored and utilized by the processor for determining the appropriate currents. An example of how such laws may be applied with two-phase commutation in a somewhat different environment are taught in "Magnetic Arrays for Synchronous Machines", D. L. Trumper., M. E. Williams and T. H. Nguyen, Proceedings of the IEEE IAS 28th Annual Meeting, pp 9–18, October 1993. Assuming that each winding 20, 22 has two phases, the force vectors $F_H$ (i.e. $F_x$ or $F_y$, as appropriate) and $F_z$ for the winding are discussed in the beforementioned Trumper et al. IEEE TIA March–April 1996 article, the contents of which are incorporated herein by reference, and may be defined as follows:

$$F_H = \mu_0 M_0 G \eta_0 e^{-\gamma_1 z_0} (I_1 \cos \gamma_1 x_0 + I_2 \sin \gamma_1 x_0) \quad (1)$$

$$F_v = \mu_0 M_0 G \eta_0 e^{-\gamma_1 z_0} (-I_1 \sin \gamma_1 x_0 + I_2 \cos \gamma_1 x_0) \quad (2)$$

where, $\mu_0$=permeability of free space=$4\pi \times 10^{-7}$ H/m $\mu_0 M_0$=remanence of the permanent magnets G=a motor geometric constant (see Eq. 2 of Trumper et al article for more detailed definition)

$\eta_0$=turn density of windings $\gamma_1 = 2\pi/l$ l=pitch of motor $I_1$=current in the first winding.

$I_2$=current in the second winding.

$z_0$=motor air gap $x_0$=lateral displacement of magnet array relative to stator Therefore, a computer knowing the precise existing position of the stage from the sensors and the precise desired position of the stage may determine the forces necessary from each winding to achieve a desired correction, and may then use the above equations to determine appropriate currents, polarities and phases for the wires of each winding to achieve the desired forces. Typically, the force vectors generated are selected only to move the stage in the desired direction(s) at a selected speed, with position feedback being relied upon to stop the stage at the desired position. The control algorithms to command the forces are generally well-known (Biernson, G., "Principles of Feedback Control, Vols. 1 and 2", Wiley-Interscience, 1988).

While for the preferred embodiment shown in FIGS. 1 and 2, the structure has been simplified by energizing the coils 20, 22 to generate forces in the "z" direction sufficient to support the weight of stage 10, the simplicity of design in these situations is somewhat offset by the electric energy required to perform this function. Therefore, in some applications, it may be preferable to provide a permanent magnet coacting with a target to perform this function. For example, a permanent magnet may be positioned near each corner of the top surface of stage 10 adjacent area 14, which magnet coacts with a suitable target positioned above the stage to support the stage with no load thereon, thus requiring "z" forces to be generated only to perform corrections in the "z" direction, to perform or compensate for rotations around the x and y axis, or to compensate for the weight of a load on the stage in, for example, area 14.

FIG. 2a shows an alternative embodiment of the invention wherein the magnet array 16 is a Halbach magnet array 16' rather than the conventional magnetic array shown in FIG. 2. For this embodiment, the magnet 18 would also preferably be a Halbach magnet array. Halbach magnet arrays are discussed in beforementioned U.S. Pat. No. 5,631,618 and the array 16' has the characteristics and advantages discussed for Halbach arrays in this copending application. In particular, such arrays provide magnetic fields which appear primarily on one side of the array, with no requirement for an iron array backing plate, and with a stronger field than that of a conventional array 16, and thus allows a light weight stage, and provides a power efficient mechanism for providing the magnetic force vectors. More specific details are discussed in several articles by K. Halbach ("Design of Permanent Multipole Magnetics with Oriented Rare Earth Cobalt Materials", *Nuclear Instruments and Methods*, Vol. 169, No. 1, pp 1–10, 1980; "Application of Permanent Magnets in Accelerators and Electron Storage Rings", *Journal of Applied Physics*, Vol. 57, No. 8, pp 3605–3608, 1985). As may be seen from FIG. 2a, these arrays differ from the standard arrays in that each adjacent magnet segment is oriented around an axis perpendicular to the direction in which the array extends by an angle which differs from that of the adjacent segment by a selected angle, which angle is 90° in FIG. 2a but could for example be 45° or some other appropriate angle. This results in magnetic axes which are both array normal and array parallel. As taught by Halbach, the angle of rotation and the direction of rotation are the same for each adjacent pair of magnet segments. An added advantage of these arrays is that they provide a field which is a factor of 1.4 stronger than the field for more conventional magnetic arrays of the same volume.

FIG. 3 shows an alternate embodiment of the invention which is the same as that shown in FIG. 1 except that stage 10' is slightly larger and more rectangular than stage 10, and magnet 18 has been replaced with either one magnet 18' (dashed and solid lines) which is sized the same as magnet 16 so as to always extend over two coils 22 rather than over a single coil as for the embodiment shown in FIG. 1, or with a pair of magnets 18A, 18B (solid lines only) which extend over the same coils 22 as the magnet 18'. For this embodiment, with stage 10' centered in the "y" direction, the widths "W" shown in the figure will all be substantially equal. The stage may thus travel approximately 2 W in the "y" direction. W may, for example, be 100 mm, resulting in a stage width of approximately 400 mm and an overall width for the system of approximately 600 mm.

The system of FIG. 3 would operate in substantially the same manner as the system of FIG. 1 except that two coils 22 would normally be activated to cause motion in the "x" direction. Any potential rotation of the stage as a result of activation in the "x" direction could be overcome by activating the "y" coils in the manner previously indicated. However, being able to simultaneously apply forces from two coils 22 will increase the power efficiency of producing forces in the "x" direction relative to the embodiment of FIG. 1.

For the various embodiments shown, it is assumed that permanent magnets are on the stage and that the electromagnets are on the stator/platform, and this is clearly preferred since it eliminates thermal expansion error in the stage caused by resistive loss in the winding, permitting more positive positioning of the stage, and also eliminates cables connecting from the power amplifiers to the stage, these cables causing problems in terms of friction and dynamics. However, this is not a limitation on the invention. Therefore, where the above problems can be tolerated, improved power efficiency can be achieved by having the windings on the stage and the permanent magnets on the stator, this resulting in much smaller windings. Further, while the stator 12 has been shown below stage 10 in the figures, this is also not a limitation on the invention, and the system could be designed with the stator above the stage. This would result in the direction of the "z" force vectors to support the weight of the stage being reversed. Additionally, the stage can be operated at any angle with respect to vertical. For instance, the stator may lie in a vertical plane with gravity then pointing in the "x" or "y" directions. In addition, while in FIG. 1 the system provides extended travel in only the "x" direction, with suitable modifications, the system could also be designed to provide extended travel in the y direction or in both the "x" and "y" directions, although this would be more complicated. Conversely, if extended travel in the "x" direction is not required, then only coils 20B, 20C and 22B need be provided. Therefore, while the invention has been particularly shown and described above with reference to preferred embodiments, the foregoing and other changes in form and detail may be made therein by one skilled in the art without departing from the spirit and scope of the invention, which invention is to be defined only by the following claims.

What is claimed is:

1. A magnetic positioner with long travel in two dimensions and short travel in four dimensions comprising:

a movable stage, a stator oriented adjacent and substantially parallel to said stage;

at least three sets of windings on the portion of said stator adjacent said stage, at least two of said windings providing drive forces, when energized, in a first of said long travel dimensions, and at least one of said windings providing drive forces, when energized, in a second of said long travel dimensions; and at least two magnet arrays on said stage adjacent said stator, at least one of said magnet arrays being adjacent to at least two of said windings for all positions of said stage relative to said stator;

each magnet array and adjacent at least one winding being poled and oriented to form a linear motor providing forces in both the corresponding long travel dimension and in a dimension perpendicular to the both said long travel dimensions.

2. A magnetic positioner as claimed in claim 1 including means for normally supporting the weight of said stage.

3. A magnetic positioner as claimed in claim 2 wherein said means for normally supporting the weight of said stage includes coacting magnets and targets.

4. A magnetic positioner as claimed in claim 1 wherein there are two of said magnetic arrays, one of which is sized and oriented to be adjacent the two windings providing forces in said first long travel dimension and the other of which is sized and oriented to be adjacent a single winding providing forces in said second long travel dimension.

5. A magnetic positioner as claimed in claim 1 wherein there are two of said magnetic arrays, one of which is sized and oriented to be adjacent two windings providing forces in said first long travel dimension and the other of which is sized and oriented to be adjacent two windings providing forces in said second long travel dimension.

6. A magnetic positioner as claimed in claim 1 wherein there are three of said magnetic arrays, one of which is sized and oriented to be adjacent two windings providing forces in said first long travel dimension and the other two of which are sized and oriented to be adjacent a different winding providing forces in said second long travel dimension.

7. A magnetic positioner as claimed in claim 1 wherein at least one of the magnet arrays, which array is adjacent at least two of said windings, is a Halbach magnet array.

8. A magnetic positioner with long travel in two dimensions and short travel in four dimensions comprising:

a movable stage, a stator oriented adjacent and substantially parallel to said stage;

at least three sets of first magnetic elements on the portion of said stator adjacent said stage at any given time;

at least two second magnetic elements on said stage adjacent said stator, at least one of said second magnetic elements overlapping multiple first magnetic elements for all positions of said stage relative to said stator;

at least one of said first and second magnetic elements being sets of multiphase windings, each adjacent pair of first and second magnetic elements being poled and oriented to form a linear motor providing forces in both a corresponding long travel dimension and in a dimension perpendicular to both said long travel dimensions.

9. A magnetic positioner as claimed in claim 8 wherein one of said first and second magnetic elements are sets of windings and the other of said first and second magnetic elements are magnet arrays.

10. A magnetic positioner as claimed in claim 9 wherein the first magnetic elements on said stator are sets of windings and wherein the second magnetic elements on the stage are magnet arrays.

11. A magnetic positioner as claimed in claim 10 wherein one of said magnet arrays overlaps two of said sets of windings and the other of said magnet arrays overlaps a single set of windings for all positions of the stage.

12. A magnetic positioner as claimed in claim 10 wherein each of said magnet arrays overlap at least two of said sets of windings for all positions of the stage.

13. A magnetic positioner as claimed in claim 9 wherein said sets of windings are wound with multiple phases to provide forces both in a direction transverse to the stator in one of said long travel directions and in a direction perpendicular to said windings and to said long travel dimensions.

14. A magnetic positioner as claimed in claim 9 wherein at least one of said magnetic arrays is a Halbach magnetic array.

15. A magnetic positioner as claimed in claim 8 wherein there is at least one of said sets of first magnetic elements which is not adjacent the stage at any given time, and wherein the at least three first magnetic elements adjacent the stage at a given time changes as the stage moves in at least one of said long travel dimensions.

* * * * *